US010991724B2

(12) United States Patent
Jiang

(10) Patent No.: US 10,991,724 B2
(45) Date of Patent: Apr. 27, 2021

(54) CMOS TRANSISTOR AND METHOD FOR FABRICATING THE SAME, DISPLAY PANEL AND DISPLAY DEVICE

(71) Applicant: BOE TECHNOLOGY GROUP CO., LTD., Beijing (CN)

(72) Inventor: Chunsheng Jiang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/227,012

(22) Filed: Dec. 20, 2018

(65) Prior Publication Data

US 2019/0123070 A1 Apr. 25, 2019

Related U.S. Application Data

(62) Division of application No. 14/422,365, filed as application No. PCT/CN2014/074038 on Mar. 25, 2014, now abandoned.

(30) Foreign Application Priority Data

Dec. 26, 2013 (CN) ......................... 201310732715.1

(51) Int. Cl.
*H01L 27/12* (2006.01)
*H01L 27/092* (2006.01)
(Continued)

(52) U.S. Cl.
CPC ........ *H01L 27/1225* (2013.01); *H01L 27/092* (2013.01); *H01L 27/127* (2013.01);
(Continued)

(58) Field of Classification Search
CPC .................................................. H01L 27/1255
See application file for complete search history.

(56) References Cited

U.S. PATENT DOCUMENTS 9,293,597 B2 * 3/2016 Uchiyama ......... H01L 29/78696
9,741,750 B2 * 8/2017 Jiang ....................... H01L 21/77
(Continued)

FOREIGN PATENT DOCUMENTS

CN 1619392 A 5/2005
CN 1806322 A 7/2006
(Continued)

OTHER PUBLICATIONS

Search Report issued in International application No. PCT/CN2014/074038, dated Mar. 25, 2014 (Mar. 25, 2014).
(Continued)

*Primary Examiner* — Abul Kalam
(74) *Attorney, Agent, or Firm* — Nath, Goldberg & Meyer; Joshua B. Goldberg

(57) ABSTRACT

The present disclosure provides a CMOS transistor and a method for fabricating the same, a display panel and a display device. The method includes: forming a first gate electrode, a second gate electrode, a first active layer, a second active layer, a first source electrode, a second source electrode, a first drain electrode and a second drain electrode on a base substrate; and injecting first dopant ions into the first active layer and injecting second dopant ions into the second active layer by a doping process, wherein a concentration of the first dopant ions is smaller than that of the second dopant ions, the first active layer is an n-type active layer, and the second active layer is a p-type active layer.

9 Claims, 3 Drawing Sheets

(51) Int. Cl.
*H01L 29/22* (2006.01)
*H01L 29/36* (2006.01)

(52) U.S. Cl.
CPC ...... *H01L 27/1259* (2013.01); *H01L 27/1288* (2013.01); *H01L 29/22* (2013.01); *H01L 29/36* (2013.01)

(56) References Cited

U.S. PATENT DOCUMENTS

| | | | | |
|---|---|---|---|---|
| 2005/0099551 | A1 | 5/2005 | Yang et al. | |
| 2010/0176395 | A1 | 7/2010 | Choi et al. | |
| 2012/0196429 | A1* | 8/2012 | Tezuka | H01L 21/2652 438/527 |
| 2013/0175535 | A1 | 7/2013 | Hotta | |
| 2013/0187154 | A1 | 7/2013 | Uchiyama et al. | |
| 2014/0094002 | A1* | 4/2014 | Ma | H01L 21/24 438/151 |
| 2016/0365361 | A1* | 12/2016 | Jiang | H01L 21/77 |

FOREIGN PATENT DOCUMENTS

| | | | |
|---|---|---|---|
| CN | 101582453 | A | 11/2009 |
| CN | 103000631 | A | 3/2013 |
| WO | 2011135945 | A1 | 11/2011 |

OTHER PUBLICATIONS

Form PCT/ISA/237 issued in International application No. PCT/CN2014/0744038.

1st Office Action issued in Chinese application No. 201310732715.1 dated Sep. 15, 2015.

* cited by examiner

CMOS TRANSISTOR AND METHOD FOR FABRICATING THE SAME, DISPLAY PANEL AND DISPLAY DEVICE

CROSS-REFERENCE TO RELATED APPLICATIONS

This patent application is division of U.S. patent application Ser. No. 14/422,365, filed on Feb. 19, 2015, entitled CMOS TRANSISTOR AND METHOD FOR FABRICATING THE SAME, DISPLAY PANEL AND DISPLAY DEVICE, which is a 371 of PCT/CN2014/074038, filed on Mar. 25, 2014, which claims priority of Chinese Patent Application No. CN 201310732715.1, field on Dec. 26, 2013, the content of each of which is hereby incorporated by reference in its entirety.

TECHNICAL FIELD

The present disclosure relates to the field of touch panel technology, and particularly to a CMOS transistor and a method for fabricating the same, a display panel and a display device.

BACKGROUND

Complementary metal oxide semiconductor (referred to as CMOS) consists of positive channel metal oxide semiconductor (referred to as PMOS) and negative channel metal oxide semiconductor (referred to as NMOS). CMOS has a characteristic of low power consumption and is widely used in integrated circuits.

A bottom gate type thin film transistor formed by six mask patterning processes in the prior art comprises a switching thin film transistor and a driving thin film transistor formed simultaneously on a base substrate, the switching thin film transistor comprises a gate electrode, a gate insulation layer, an active layer, an etch stop layer, source and drain electrodes, a passivation layer, a first channel and a pixel electrode, and the driving thin film transistor comprises a gate electrode, a passivation layer, a second channel and a pixel electrode, so that a jump layer connection between the switching thin film transistor and the driving thin film transistor is implemented, but such a structure may increase power consumption when applied to a display panel.

SUMMARY

The present disclosure provides a CMOS transistor and a method for fabricating the same, a display panel and a display device, which may reduce the power consumption of the display panel.

To achieve the above objective, the present disclosure provides a CMOS transistor comprising a first region and a second region provided on a base substrate, the first region comprises a first gate electrode, a first active layer, a first source electrode and a first drain electrode, and the second region comprises a second gate electrode, a second active layer, a second source electrode and a second drain electrode, first dopant ions are formed in the first active layer, second dopant ions are formed in the second active layer, a concentration of the first dopant ions is smaller than that of the second dopant ions, the first active layer is an n-type active layer, and the second active layer is a p-type active layer.

Optionally, an etch stop layer is further formed between the first active layer and the first source electrode and the first drain electrode and between the second active layer and the second source electrode and the second drain electrode.

Optionally, the first active layer is oxide material layer, and the second active layer is oxide material layer.

Optionally, the oxide material is zinc oxide.

Optionally, a first via hole, a second via hole, a third via hole and a fourth via hole are formed in the etch stop layer, the first source electrode and the first drain electrode are connected with the first active layer through the first via hole and the second via hole, respectively, and the second source electrode and the second drain electrode are connected with the second active layer through the third via hole and the fourth via hole, respectively.

Optionally, the first dopant ions and the second dopant ions are both N ions.

To achieve the above objective, the present disclosure provides a display panel, comprising the above CMOS transistor.

To achieve the above objective, the present disclosure provides a display device, comprising the above display panel. To achieve the above objective, the present disclosure provides a method for fabricating a CMOS transistor, comprising steps of: forming a first gate electrode, a second gate electrode, a first active layer, a second active layer, a first source electrode, a second source electrode, a first drain electrode and a second drain electrode on a base substrate; and injecting first dopant ions into the first active layer and injecting second dopant ions into the second active layer by a doping process, a concentration of the first dopant ions is smaller than that of the second dopant ions, the first active layer is an n-type active layer, and the second active layer is a p-type active layer.

Optionally, the step of forming a first gate electrode, a second gate electrode, a first active layer, a second active layer, a first source electrode, a second source electrode, a first drain electrode and a second drain electrode on a base substrate comprises: forming the first gate electrode and the second gate electrode on the base substrate by a patterning process; forming the first active layer and the second active layer on the base substrate on which the first gate electrode and the second gate electrode are formed; and forming the first source electrode, the second source electrode, the first drain electrode and the second drain electrode on the first active layer and the second active layer by a patterning process.

Optionally, a planarization layer is formed on the first source electrode, the second source electrode, the first drain electrode and the second drain electrode before injecting the dopant ions; the step of injecting first dopant ions into the first active layer and injecting second dopant ions into the second active layer by a doping process comprises: forming a photoresist layer on the planarization layer, the photoresist layer comprising a first photoresist region and a second photoresist region, the first photoresist region corresponding to the first active layer, and the second photoresist region corresponding to the second active layer; performing the doping process on the first active layer through the first photoresist region to inject N ions into the first active layer; performing the doping process on the second active layer through the second photoresist region to inject N ions into the second active layer; and removing the photoresist layer.

Optionally, the step of forming the photoresist layer on the planarization layer comprises: applying photoresist on the planarization layer; and performing mask plate masking and exposure by using a half tone mask and performing development to form the first photoresist region and the second photoresist region.

Optionally, a thickness of the first photoresist region is larger than that of the second photoresist region.

Optionally, the thickness of the photoresist layer is equal to or larger than 3 μm, the thickness of the first photoresist region is ranged from 1.7 μm to 2.3 μm, and the thickness of the second photoresist region is ranged from 0.7 μm to 1.3 μm.

Optionally, the first active layer and the second active layer are made of oxide material.

Optionally, the oxide material is zinc oxide.

Optionally, before forming the first source electrode, the second source electrode, the first drain electrode and the second drain electrode, an etch stop layer is formed on the first active layer and the second active layer by a patterning process, and a first via hole, a second via hole, a third via hole and a fourth via hole are formed in the etch stop layer, so that the first source electrode and the first drain electrode are connected with the first active layer through the first via hole and the second via hole, respectively, and the second source electrode and the second drain electrode are connected with the second active layer through the third via hole and the fourth via hole, respectively.

Optionally, the first dopant ions and the second dopant ions are both N ions.

In the CMOS transistor and the method for fabricating the same, the display panel and the display device, the concentration of the first dopant ions is smaller than that of the second dopant ions, and the first active layer is an n-type active layer and the second active layer is a p-type active layer, which may reduce the power consumption of the display panel.

DETAILED DESCRIPTION

To make those skilled in the art better understand the technical solutions of the present disclosure, the CMOS transistor and the method for fabricating the same, the display panel and the display device provided by the present disclosure will be described as below in details in conjunction with the accompanying drawings.

Figure 1:
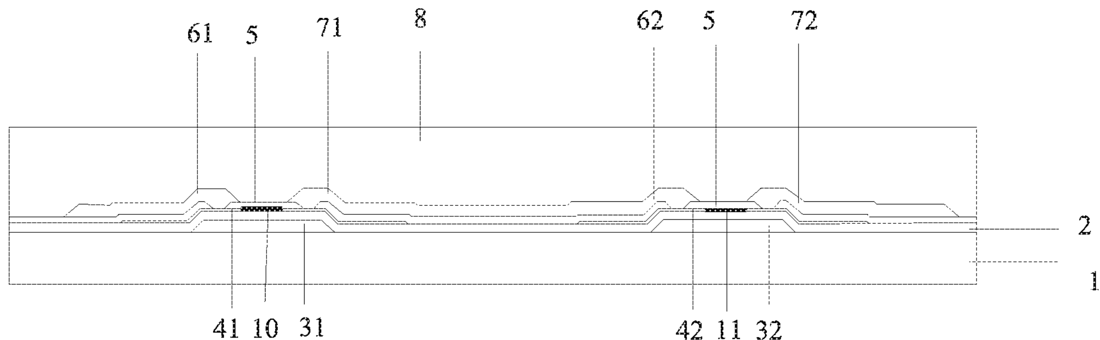
FIG. 1 is a schematic diagram of a structure of a CMOS transistor according to a first embodiment of the present disclosure.

FIG. 1 is a schematic diagram of a structure of a CMOS transistor according to a first embodiment of the present disclosure. As shown in FIG. 1, the CMOS transistor comprises a first region and second region provided on a base substrate 1, the first region comprises a first gate electrode 31, a first active layer 41, a first source electrode 61 and a first drain electrode 71 provided on the base substrate 1, and the second region comprises a second gate electrode 32, a second active layer 42, a second source electrode 62 and a second drain electrode 72 provided on the base substrate 1. In the transistor, first dopant ions are formed in the first active layer 41, second dopant ions are formed in the second active layer 42, and a concentration of the first dopant ions is smaller than that of the second dopant ions. For example, both of the first dopant ions and the second dopant ions are N ions. In the transistor, the first active layer 41 is an n-type active layer, the second active layer 42 is a p-type active layer, the first region is a NMOS region, and the second region is a PMOS region. The transistor according to the embodiment of the present disclosure can reduce power consumption of a display panel.

Preferably, an etch stop layer 5 is formed between the first active layer 41 and the first source and drain electrodes 61, 71 and between the second active layer 42 and the second source and drain electrodes 62, 72. The first active layer 41 is an oxide material layer, and the second active layer 42 is an oxide material layer. Further, the oxide material is zinc oxide. Since the first active layer 41 and the second active layer 42 are both oxide material layer and the oxide material has a disadvantage of corrosion intolerance, the etch stop layer 5 is formed on the first and second active layers 41, 42 for protection. In addition, in practical application, since the active layer (oxide material layer) is likely to be damaged during etching the source and drain electrodes, the etch stop layer is required to be formed on the active layer firstly and then the source and drain electrodes are fabricated.

Preferably, a gate insulation layer 2 is formed between the first gate electrode 31 and the first active layer 41 and between the second gate electrode 32 and the second active layer 42, and the first gate electrode 31 and the second gate electrode 32 are formed on the base substrate 1.

Preferably, a first via hole, a second via hole, a third via hole and a fourth via hole are formed in the etch stop layer 5. A position of the first via hole corresponds to the first source electrode 61 and the first active layer 41, a position of the second via hole corresponds to the first drain electrode 71 and the first active layer 41, a position of the third via hole corresponds to the second source electrode 62 and the second active layer 42, and a position of the fourth via hole corresponds to the second drain electrode 72 and the second active layer 42, so that the first source and drain electrodes 61, 71 are connected with the first active layer 41 through the first and second via holes, respectively, and the second source and drain electrodes 62, 72 are connected with the second active layer 42 through the third and fourth via holes, respectively. After the etch stop layer 5 is fabricated on the first active layer 41 and the second active layer 42, the first via hole, the second via hole, the third via hole and the fourth via hole are formed in the etch stop layer 5 by a dry etching or other method, and then the first source electrode 61, the second source electrode 62, the first drain electrode 71 and the second drain electrode 72 are formed on the etch stop layer 5 by a patterning process.

In the embodiment, the structure of CMOS transistor includes a bottom gate type structure and a top gate type structure. The bottom gate type structure comprises a NMOS region 10 and a PMOS region 11, the NMOS region 10 comprises the first gate electrode 31, the gate insulation layer 2, the first active layer 41, the etch stop layer 5, the first source electrode 61 and the first drain electrode 71 sequentially provided from a side of the base substrate 1 for providing the CMOS transistor, and the PMOS region 11 comprises the second gate electrode 32, the gate insulation layer 2, the second active layer 42, the etch stop layer 5, the second source electrode 62 and the second drain electrode 72 sequentially provided from the side of the base substrate 1. The top gate type structure comprises a NMOS region 10 and a PMOS region 11, the NMOS region 10 comprises the first active layer 41, the etch stop layer 5, the first source electrode 61 and the first drain electrode 71, the gate insulation layer 2 and the first gate electrode 31 sequentially provided from a side of the base substrate 1 for providing the CMOS transistor, and the PMOS region 11 comprises the second active layer 42, the etch stop layer 5, the second source electrode 62 and the second drain electrode 72, the gate insulation layer 2 and the second gate electrode 32 sequentially provided from the side of the base substrate 1.

It should be noted that, the CMOS transistor in the embodiment of the present disclosure is described by taking the bottom gate type thin film transistor (i.e., the gate electrode is provided below the pattern of active layer) as an example, and it is merely an exemplary description, the scope of the present disclosure is not limited thereto. The structure of the CMOS transistor may be varied according to a requirement in practical application, for example, the CMOS transistor in the technical solution of the present disclosure may also utilize the top gate type thin film transistor (i.e., the gate electrode is provided above the active layer). In the case where the CMOS transistor in the technical solution of the present disclosure is the top gate type thin film transistor, the gate insulation layer 2 is formed between the first gate electrode 31 and the first source and drain electrodes 61, 71 and between the second gate electrode 32 and the second source and drain electrodes 62, 72, and the first gate electrode 31 and the second gate electrode 32 are both formed above the gate insulation layer 2.

Figure 2:
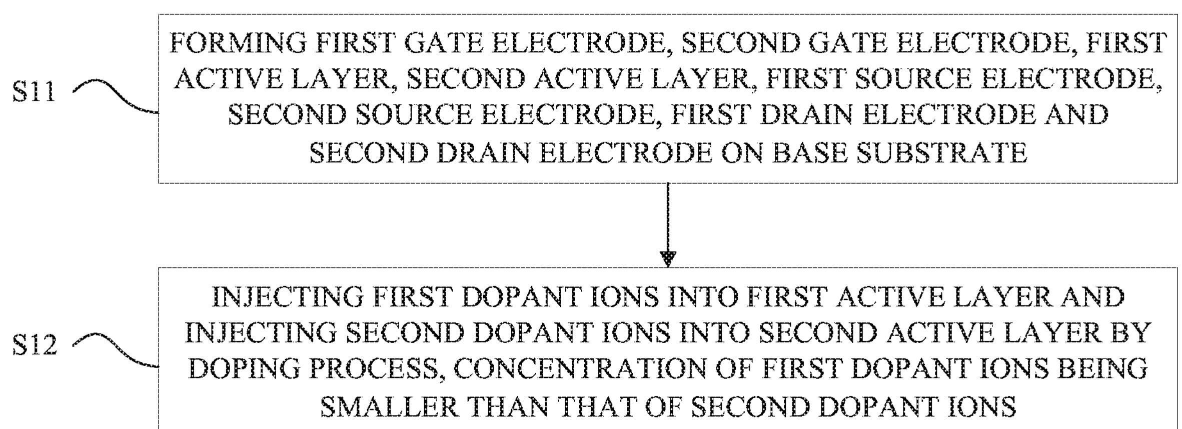
FIG. 2 is a flow chart of a method for fabricating a CMOS transistor, according to a second embodiment of the present disclosure.

FIG. 2 is a flow chart of a method for fabricating a CMOS transistor, according to a second embodiment of the present disclosure. As shown in FIG. 2, the method comprises the following steps.

In step S11, a first gate electrode, a second gate electrode, a first active layer, a second active layer, a first source electrode, a second source electrode, a first drain electrode and a second drain electrode are formed on a base substrate.

Specifically, by taking a bottom gate type thin film transistor as an example, step S111 may comprise the following steps.

In step S111, the first gate electrode and the second gate electrode are formed on the base substrate by a patterning process.

In step S112, the first active layer and the second active layer are formed on the base substrate on which the first gate electrode and the second gate electrode are formed, by a patterning process.

Before step S112, the method further comprises forming a gate insulation layer on the first gate electrode and the second electrode. After the gate insulation layer is formed, the first active layer and the second active layer are respectively formed on the regions of the gate insulation layer corresponding to the first gate electrode and the second gate electrode by a patterning process.

Figure 3A:
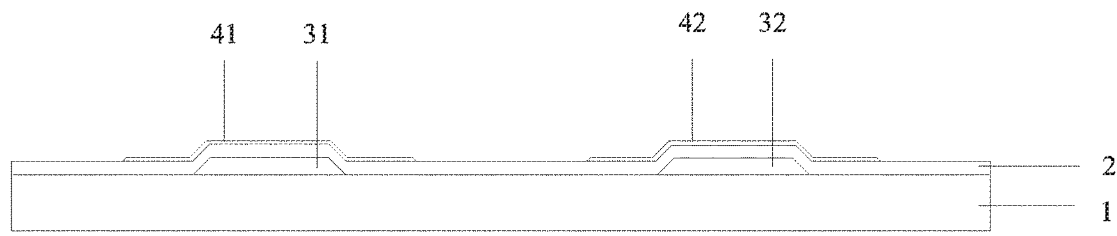
FIG. 3*a* is a schematic diagram illustrating forming a first gate electrode, a second gate electrode, a first active layer, a second active layer and a gate insulation layer in the method for fabricating the CMOS transistor.

FIG. 3*a* is a schematic diagram illustrating forming a first gate electrode 31, a second gate electrode 32, a first active layer 41, a second active layer 42 and a gate insulation layer 2 in the method for fabricating the CMOS transistor. As shown in FIG. 3*a*, a gate metal material layer is deposited on two regions (a first region and a second region) on a base substrate 1, and the first gate electrode 31 and the second gate electrode 32 are formed by a patterning process, respectively; the gate insulation layer 2 is deposited on the first gate electrode 31 and the second gate electrode 32; an active metal oxide material layer is deposited on the regions of the gate insulation layer 2 corresponding to the first gate electrode 31 and the second gate electrode 32, the active metal oxide material is preferably zinc oxide, and the first active layer 41 and the second active layer 42 are formed by a patterning process, respectively.

In step S113, the first source electrode, the second source electrode, the first drain electrode and the second drain electrode are formed on the first active layer and the second active layer by a patterning process.

Figure 3B:
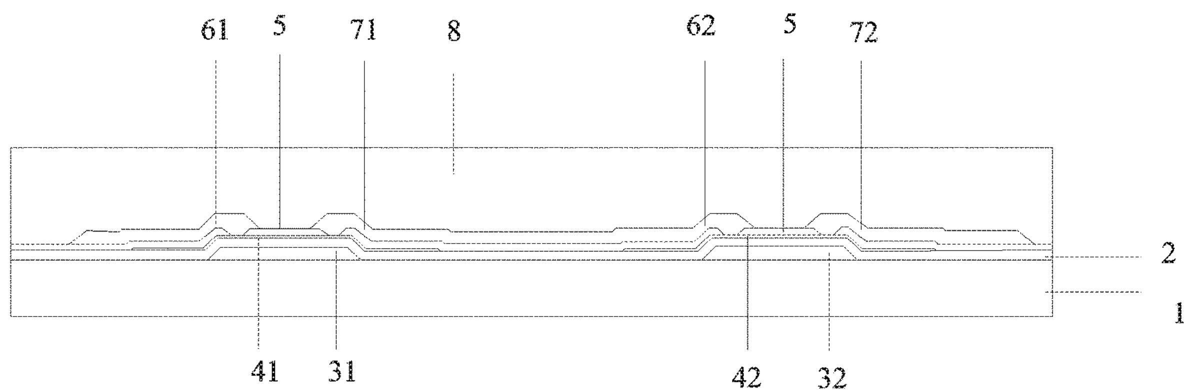
FIG. 3*b* is a schematic diagram illustrating forming a first source electrode, a first drain electrode, a second source electrode and a second drain electrode in the method for fabricating the CMOS transistor.

FIG. 3*b* is a schematic diagram illustrating forming the first source electrode 61, the first drain electrode 71, the second source electrode 62 and the second drain electrode 72 in the method for fabricating the CMOS transistor. As shown in FIG. 3*b*, a source and drain metal material layer is deposited on the first active layer 41 and the second active layer 42, and the first source electrode 61, the first drain electrode 71, the second source electrode 62 and the second drain electrode 72 are formed by a patterning process, respectively. In the embodiment, the patterning process may at least include photoresist coating, mask plate masking, exposure, development and photoresist stripping.

Preferably, between step S112 and step S113, the method further comprises forming an etch stop layer on the first active layer and the second active layer by a patterning process. After the etch stop layer is formed, the first source electrode, the second source electrode, the first drain electrode and the second drain electrode are formed on the etch stop layer by a patterning process.

In step S12, first dopant ions are injected into the first active layer and second dopant ions are injected into the second active layer, by a doping process, a concentration of the first dopant ions is smaller than that of the second dopant ions.

Specifically, the first active layer 41 and the second active layer 42 are both zinc oxide material layer. The first dopant ions and the second dopant ions are both N ions. During injecting the first dopant ions into the first active layer 41 and injecting the second dopant ions into the second active layer 42 by the doping process, does and energy of ion implantation for the first active layer 41 and the second active layer 42 are respectively controlled according to concentrations of zinc oxide in the first active layer 41 and the second active layer 42, so as to obtain the first dopant ions and the second dopant ions with different concentrations of dopant ions and allow the concentration of the first dopant ions to be smaller than that of the second dopant ions. After the doping process, the first active layer 41 is an N type active layer, and the second active layer 42 is a P type active layer.

Preferably, between step S11 and step S12, the method further comprises forming a planarization layer 8 on the first source electrode 61, the second source electrode 62, the first drain electrode 71 and the second drain electrode 72, as shown in FIG. 3*b*.

Specifically, step S12 may comprise the following steps.

In step S121, a photoresist layer is formed on the planarization layer 8, the photoresist layer includes a first photoresist region and a second photoresist region, the first photoresist region corresponds to the first active layer, and the second photoresist region corresponds to the second active layer.

Figure 3C:
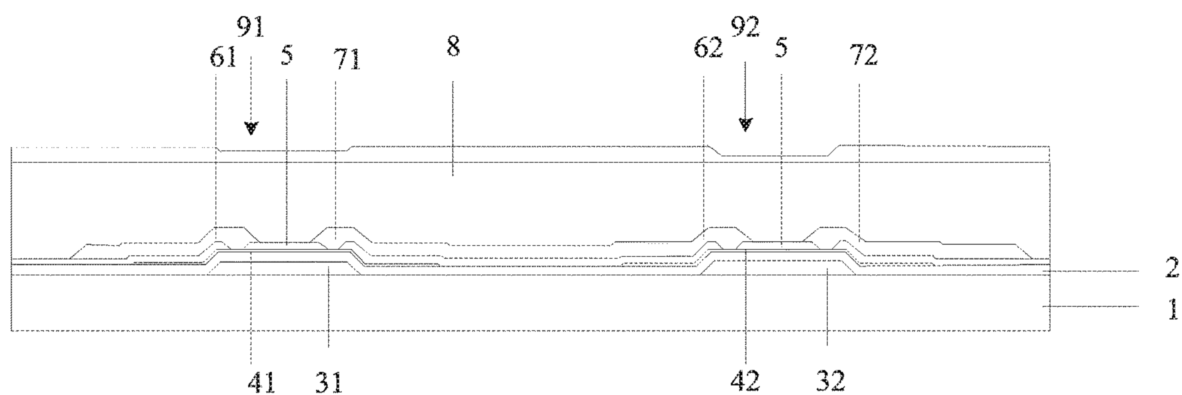
FIG. 3*c* is a schematic diagram illustrating forming a photoresist layer in the method for fabricating the CMOS transistor.

FIG. 3*c* is a schematic diagram illustrating forming a photoresist layer in the method for fabricating the CMOS transistor. As shown in FIG. 3*c*, specifically, forming the photoresist layer on the planarization layer 8 comprises: applying a photoresist layer on the planarization layer 8, a thickness of the photoresist layer being equal to or larger than 3 μm; and performing mask plate masking and exposure on the photoresist layer by using a half tone mask plate and performing development to form the first photoresist region 91 and the second photoresist region 92. The thickness of the first photoresist region 91 is larger than that of the second photoresist region 92, preferably, the thickness of the first photoresist region is ranged from 1.7 μm to 2.3 μm and the thickness of the second photoresist region is ranged from 0.7 μm to 1.3 μm.

In step S122, the doping process is performed on the first active layer through the first photoresist region, so that the N ions are injected into the first active layer.

In step S123, the doping process is performed on the second active layer through the second photoresist region, so that the N ions are injected into the second active layer.

Figure 3D:
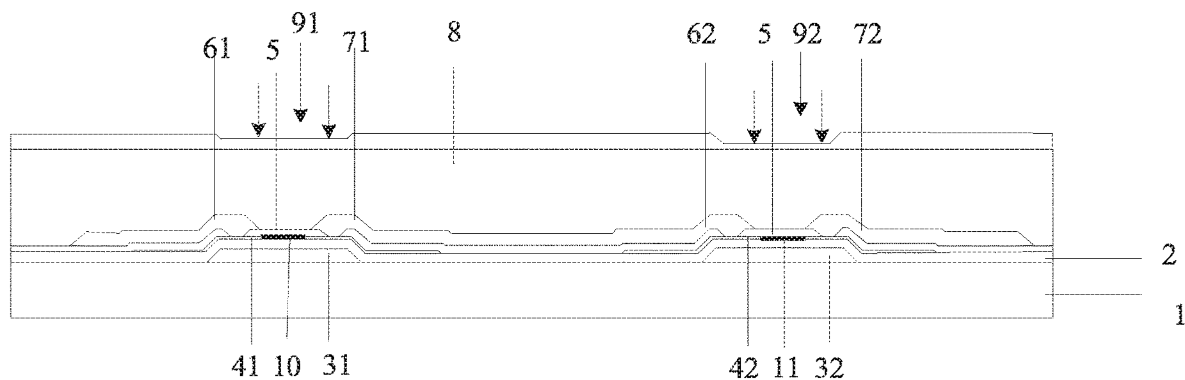
FIG. 3*d* is a schematic diagram illustrating ion implantation in the method for fabricating the CMOS transistor.

FIG. 3*d* is a schematic diagram illustrating ion implantation in the method for fabricating the CMOS transistor. As shown in FIG. 3*d*, the first photoresist region 91 corresponds to the first active layer 41, and the second photoresist layer 92 corresponds to the second active layer 42. When performing the N ion injection through the first photoresist region 91 and the second photoresist region 92, the first photoresist region 91 and the second photoresist region 92 may block N ion injection to reduce the injection concentration of N ion. Since the thickness of the first photoresist region 91 is larger than that of the second photoresist region 92, so that the concentration of N ions injected into the first active layer 41 through the first photoresist region 91 is smaller than that of N ions injected into the second active layer 42 through the second photoresist region 92.

In step S124, the photoresist layer is removed.

Figure 3E:
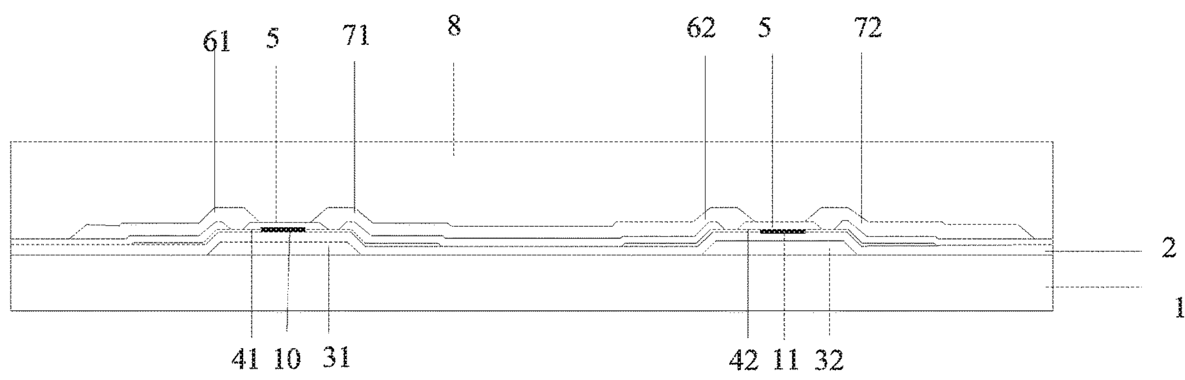
FIG. 3*e* is a schematic diagram illustrating removing the photoresist layer in the method for fabricating the CMOS transistor.

FIG. 3*e* is a schematic diagram illustrating removing the photoresist layer in the method for fabricating the CMOS transistor. As shown in FIG. 3*e*, the remaining photoresist layer is removed to result in the CMOS transistor.

Preferably, the first active layer 41 and the second active layer 42 are both made of oxide material. The oxide material is zinc oxide.

Preferably, in the step of forming the etch stop layer (i.e., between step S112 and step S113), the method further comprises forming a first via hole, a second via hole, a third via hole and a fourth via hole in the etch stop layer by a patterning process, a position of the first via hole corresponds to the first source electrode and the first active layer, a position of the second via hole corresponds to the first drain electrode and the first active layer, a position of the third via hole corresponds to the second source electrode and the second active layer, and a position of the fourth via hole corresponds to the second drain electrode and the second active layer, so that the first source electrode and the first drain electrode are connected with the first active layer through the first via hole and second via hole, respectively, and the second source electrode and the second drain electrode are connected with the second active layer through the third via hole and fourth via hole, respectively.

A third embodiment of the present disclosure provides a display panel that comprises CMOS transistors.

The CMOS transistor in this embodiment utilizes the CMOS transistor in the first embodiment, and the specific implementation thereof refers to the first embodiment and will not be described in detail herein.

A fourth embodiment of the present disclosure provides a display device that comprises a display panel, and the display panel comprises CMOS transistors.

The display device in this embodiment utilizes the CMOS transistor in the first embodiment, and the specific implementation thereof refers to the first embodiment and will not be described in detail herein.

It should be understood that, the implementations described above are merely exemplary implementations for describing the principle of the present disclosure, but the present disclosure is not limited thereto. For the persons skilled in the art, various variations and improvements may be made without departing from the spirit and essence of the present disclosure, and these variations and improvements shall be deemed as falling within the protection scope of the present disclosure.

What is claimed is:

1. A method for fabricating a CMOS transistor, comprising steps of:

forming a first gate electrode, a second gate electrode, a first active layer, a second active layer, a first source electrode, a second source electrode, a first drain electrode and a second drain electrode on a base substrate; and injecting first dopant ions into the first active layer and injecting second dopant ions into the second active layer by a doping process, wherein a concentration of the first dopant ions is smaller than that of the second dopant ions, the first active layer is an n-type active layer, and the second active layer is a p-type active layer, forming a planarization layer on the first source electrode, the second source electrode, the first drain electrode and the second drain electrode before injecting the dopant ions;

wherein the step of injecting first dopant ions into the first active layer and injecting second dopant ions into the second active layer by a doping process comprises:

forming a photoresist layer on the planarization layer, the photoresist layer comprising a first photoresist region and a second photoresist region, the first photoresist region corresponding to the first active layer, and the second photoresist region corresponding to the second active layer;

performing the doping process on the first active layer through the first photoresist region to inject the first dopant ions into the first active layer;

performing the doping process on the second active layer through the second photoresist region to inject the second dopant ions into the second active layer; and removing the photoresist layer.

2. The method for fabricating the CMOS transistor of claim 1, wherein the step of forming a first gate electrode, a second gate electrode, a first active layer, a second active layer, a first source electrode, a second source electrode, a first drain electrode and a second drain electrode on a base substrate comprises:

forming the first gate electrode and the second gate electrode on the base substrate by a patterning process;

forming the first active layer and the second active layer on the base substrate on which the first gate electrode and the second gate electrode are formed; and forming the first source electrode, the second source electrode, the first drain electrode and the second drain electrode on the first active layer and the second active layer by a patterning process.

3. The method for fabricating the CMOS transistor of claim 1, wherein the step of forming the photoresist layer on the planarization layer comprises:

applying photoresist on the planarization layer; and performing mask plate masking and exposure by using a half tone mask and performing development to form the first photoresist region and the second photoresist region.

4. The method for fabricating the CMOS transistor of claim 3, wherein a thickness of the first photoresist region is larger than that of the second photoresist region.

5. The method for fabricating the CMOS transistor of claim 4, wherein the thickness of the photoresist layer is equal to or larger than 3 μm, the thickness of the first photoresist region is ranged from 1.7 μm to 2.3 μm, and the thickness of the second photoresist region is ranged from 0.7 μm to 1.3 μm.

6. The method for fabricating the CMOS transistor of claim 1, wherein the first active layer and the second active layer are made of oxide material.

7. The method for fabricating the CMOS transistor of claim 6, wherein the oxide material is zinc oxide.

8. The method for fabricating the CMOS transistor of claim 1, wherein before forming the first source electrode, the second source electrode, the first drain electrode and the second drain electrode, an etch stop layer is formed on the first active layer and the second active layer by a patterning process, and a first via hole, a second via hole, a third via hole and a fourth via hole are formed in the etch stop layer, so that the first source electrode and the first drain electrode are connected with the first active layer through the first via hole and the second via hole, respectively, and the second source electrode and the second drain electrode are connected with the second active layer through the third via hole and the fourth via hole, respectively.

9. The method for fabricating the CMOS transistor of claim 1, wherein the first dopant ions and the second dopant ions are both N type ions.

* * * * *